United States Patent [19]

Denda et al.

[11] Patent Number: 4,535,530
[45] Date of Patent: Aug. 20, 1985

[54] PROCESS FOR MANUFACTURING A SEMICONDUCTOR MEMORY DEVICE

[75] Inventors: Masahiko Denda, Kobe; Shinichi Sato, Nishinomiya; Natsuro Tsubouchi, Kawanishi; Shigeji Kinoshita, Itami; Yoshikazu Ohbayashi, Ashiya, all of Japan

[73] Assignee: Mitsubishi Denki Kabushiki Kaisha, Tokyo, Japan

[21] Appl. No.: 596,577

[22] Filed: Apr. 5, 1984

Related U.S. Application Data

[62] Division of Ser. No. 267,521, May 27, 1981, abandoned.

[30] Foreign Application Priority Data

Jun. 3, 1980 [JP] Japan ................. 55-75206

[51] Int. Cl.³ .................. H01L 21/425; H01L 21/265
[52] U.S. Cl. ...................... 29/571; 29/576 B; 29/577 C; 148/1.5; 148/175; 148/187; 357/91; 357/23.6; 357/23.12; 357/23.13
[58] Field of Search ............... 29/571, 576 B, 577 C; 148/1.5, 175, 187; 357/91, 23 C, 23 D, 23 G, 23 P

[56] References Cited

U.S. PATENT DOCUMENTS

| | | | |
|---|---|---|---|
| 4,112,575 | 9/1978 | Fu et al. | 29/577 C |
| 4,168,997 | 9/1979 | Compton | 148/175 |
| 4,196,228 | 4/1980 | Priel et al. | 148/1.5 |
| 4,247,862 | 1/1981 | Klein et al. | 357/23 C X |
| 4,313,253 | 2/1982 | Hendersen, Sr. | 29/571 |
| 4,328,610 | 5/1982 | Thompson et al. | 29/571 |
| 4,350,536 | 9/1982 | Nakano et al. | 148/1.5 |
| 4,403,399 | 9/1983 | Taylor | 29/574 |

FOREIGN PATENT DOCUMENTS

55-55557  4/1980  Japan .................. 357/23 C

OTHER PUBLICATIONS

Sugarman et al., IBM-TDB, 23, (Jul. 1980), 616.
Brodsky, M., "*Hardening RAMs Against Sort Errors*", Electronics, Apr. 24, 1980, pp. 117–122.
Capece, R. P., "*Alphas Stymie Statics*", Electronics, Mar. 15, 1979, p. 85.
Warner, R. M., Fordemwalt, J. N., Eds., "*Integrated Circuits*", McGraw-Hill Book Co., p. 29, (1965).
David Yaney et al., "Alpha-Particle Tracks in Silicon and Their Effect on Dynamic MOS RAM Reliability", IEEE Transactions on Electron Devices, vol. ED-26, No. 1, Jan. 1979, pp. 45–50.

*Primary Examiner*—Upendra Roy
*Attorney, Agent, or Firm*—Wenderoth, Lind & Ponack

[57] ABSTRACT

An n-channel MOS dynamic memory cell includes a semiconductor substrate having a p+ internal region and a p− surface region disposed on the surface of the internal region except for an n+ region serving as a bit line, a capacitor electrode disposed above the surface region, and a transfer gate disposed between the capacitor electrode and the n+ region above the surface region. The surface region except for the n+ region and a portion of the internal region disposed below the transfer gate are higher in resistivity than at least one of a portion of the internal region disposed below the capacitor electrode and another portion of the internal region disposed below the n+ region.

3 Claims, 2 Drawing Figures

PROCESS FOR MANUFACTURING A SEMICONDUCTOR MEMORY DEVICE

This application is a division of now abandoned application Ser. No. 267,521, filed May 27, 1981.

BACKGROUND OF THE INVENTION

This invention relates to a process for manufacturing a semiconductor memory device, and more particularly to improvements in manufacturing a semiconductor dynamic memory cell.

Conventional MOS dynamic random access memory devices have comprised in many cases, a multitude of n-channel dynamic memory cells each including a single transfer transistor and a single memory capacitor disposed on one surface of a p type semiconductor substrate. In recent years such memory cells have had their area reduced because of the need for high density integration. This reduction in area of the memory cell has caused a decrease in the capacitance thereof. In order to minimize or substantially eliminate the decrease in capacitance of the memory capacitor, there has been proposed a measure to thin an electrically insulating oxide film disposed in the memory capacitor and therefore lower the source voltage. A decrease in source voltage has been inevitably attended with a reduction in the amount of electric charge accumulated in the memory capacitor.

Under these circumstances, if the p type semiconductor substrate is irradiated with α rays originating from a radioactive substance included in a package for the memory cells, then a malfunction has been actualized in the memory cell. That is, those α rays cause a multitude of electron-hole pairs to be formed within the substrate and diffused into the substrate. Holes thus formed are absorbed by the p type semiconductor substrate but electrons thus formed reach the memory capacitor and/or a bit line connected to the memory capacitor through the transfer transistor. Thus, the so-called soft errors have been actualized. More specifically, the electrons are collected in the memory capacitor and/or in the bit line to erase data respectively stored in the memory capacitor and/or in the bit line.

In order to avoid such soft errors, there has been proposed a measure to use semiconductor substrates which are low in resistivity. This measure has adversely affected the resulting memory cells in that the transfer transistor increases in threshold voltage and/or in junction capacitance between the semiconductor substrate and each of the source and drain regions of the transistor. Also, a semiconductor substrate has determined the threshold voltage of the transfer transmitter, thereby resulting in a lack of controllability.

Furthermore it has been alreadily proposed to grow a high resistivity semiconductor layer on such a low resistivity semiconductor substrate according to an epitaxial growth technique and then dispose a desired semiconductor element or elements on the high resistivity semiconductor layer. However, during the epitaxial growth, an impurity from the low resistivity semiconductor substrate is diffused into the semiconductor layer being grown so as to change a resistivity of the grown layer. This has resulted in a fear that the completed transistor has deteriorated characteristics.

Accordingly, it is an object of the present invention to provide a new and improved semiconductor memory device which is resistant to α rays without the characteristics of its transfer transistor being adversely affected.

SUMMARY OF THE INVENTION

The present invention is a process of manufacturing a semiconductor memory device comprising the steps of selectively implanting, into a main surface of a semiconductor substrate of a first type of conductivity, a second type of conductivity forming impurity so as to form impurity implanted regions of said first type of conductivity which are higher in resistivity than said semiconductor substrate; epitaxially growing surface regions on said semiconductor substrate including said impurity implanted regions, said surface regions being similar in resistivity to said impurity implanted regions; forming a bit line region of said second type conductivity in said surface regions except for a portion of said surface regions which are disposed on said impurity implanted regions, said bit line region reaching said semiconductor substrate from the surface of said surface regions; and forming a gate electrode of a transfer gate transistor above said surface regions and also above said impurity implanted regions through an electrically insulating material and forming through said electrically insulating material an electrode of a capacitor above a portion of said surface regions which are located opposite to said bit line region with respect to said portion of said surface regions disposed on said impurity implanted regions.

In the abovenoted process, said semiconductor substrate may be a P type silicon substrate doped with boron and said impurity implanted regions may be formed by selectively implanting phosphorus as an N type impurity into said semiconductor substrate.

Furthermore, said semiconductor substrate may be a P type silicon substrate having a resistivity of from 1 to 0.01 Ωcm.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

Figure 1:
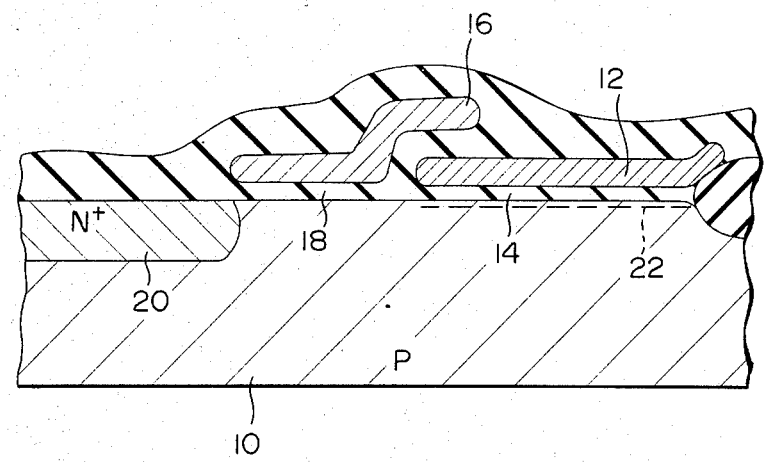
FIG. 1 is a sectional view of a memory cell of a conventional MOS dynamic random access memory device including a single transistor and a single capacitor.

Conventional n-channel MOS dynamic random access memory devices have, in many cases, comprised dynamic memory cells each including a single transistor and a single capacitor such as shown in FIG. 1 of the drawing. The illustrated arrangement comprises a p type semiconductor substrate 10, and a silicon dioxide block disposed on one surface, in this case, the upper surface as viewed in FIG. 1 of the semiconductor substrate 10. Buried in the silicon dioxide block is a first polycrystalline silicon layer 12 running in a parallel relationship with and adjacent to the upper surface of the substrate 10 to leave therebetween a silicon dioxide film 14. The layer 12 forms an electrode of a memory capacitor. Thus, the electrode is disposed above a predetermined portion of the upper surface of the semiconductor substrate 10 through the silicon dioxide film 14. Also, a second polycrystalline silicon layer 16 is buried in the silicon dioxide block running in a parallel relationship with and adjacent to the upper surface of the substrate 10 to leave therebetween a gate oxide film 18 of an n-channel MOS transistor. The second polycrystalline silicon layer 16 includes one end portion located above the adjacent end portion of the silicon dioxide film 14 and forms a gate electrode of a transfer transistor.

Furthermore, the semiconductor substrate 10 is provided on another predetermined portion of the upper surface with an n+ type impurity diffusion region 20 starting with a point substantially just below the other end of the second polycrystalline silicon layer 16 which is remote from the first polycrystalline silicon layer 12 and extending so as to be remote from the latter. The diffusion region 20 may be usually formed through the diffusion of arsenic (As) or phosphorus (P) and provides a bit line.

In operation, a source voltage is applied to the electrode of the capacitor consisting of the first polycrystalline silicon layer 12 to form a memory capacitor between the first polycrystalline silicon layer 12 and an inversion layer 22 developed in the surface region of the semiconductor substrate 10 and directly below the silicon dioxide film 14 while the impurity diffusion region 20 serves as a bit line as described above. The second polycrystalline silicon layer 16 is disposed between the memory capacitor and the n+ type diffusion region 20 and serves as the gate electrode so that a voltage applied to the silicon layer 16 through a word line (not shown) is controlled to control a channel formed between the inversion layer and the impurity diffusion region 20.

In recent years memory cells such as shown in FIG. 1 have the tendency to gradually have their area reduced because of the need for high density integration. For example, 16K bit random access memories have been of about 400 μm² per each memory cell, but 64 K bit random access memories have been of about 200 μm² per each memory cell. This reduction in area has caused a decrease in capacitance of each memory capacitor.

In order to minimize or substantially eliminate this decrease in capacitance, there have been proposed a measures to thin the silicon dioxide film 14 and so on. However, a corresponding decrease in source voltage has been inevitably attended with a reduction in the amount of electric charge accumulated in an associated memory capacitor. Accordingly, if α rays are emitted from a radioactive substance included in a package for any semiconductor memory device including a multitude of memory cells, as shown in FIG. 1, then malfunctions have been actualized due to those α rays. The malfunctions are usually called soft errors. More specifically, the α rays are incident upon a semiconductor chip for the device to form a multitude of electron-hole pairs within the silicon substrate adjacent to the surface thereof. Those electron-hole pairs are diffused into the semiconductor substrate so that holes are usually absorbed by the p type substrate but electrons reach the memory capacitor and/or the bit line. Then, the electrons are collected in a memory capacitor disposed in the substrate and/or the bit line to change data stored therein. Thus, a soft error or errors has or have occurred.

In order to avoid that soft error, there has been proposed a measure to use semiconductor substrates which are low in resistivity. This measure has adversely affected the resulting memory cells in that the transfer transistor increases in threshold voltage and/or in junction capacitance between the semiconductor substrate and each of the source and drain regions of the transistor. Also, the use of the low resistivity semiconductor substrates have been disadvantageous in that the transistor has a threshold voltage as determined by the particular semiconductor substrate thereby resulting in a lack of controllability.

Furthermore it has been already proposed to grow a high resistivity semiconductor layer on such a low resistivity semiconductor substrate according to an epitaxial growth technique and then dispose a desired semiconductor element or elements on the high resistivity semiconductor layer. However, during the epitaxial growth process an impurity from the low resistivity semiconductor substrate is diffused into the semiconductor layer being grown so as to change the resistivity of the resulting layer.

On the other hand, the effect of preventing the soft error can be enhanced by thinning a high resistivity semiconductor layer underlaid with the memory capacitor. However, as described above, the impurity from the low resistivity semiconductor substrate is diffused into the high resistivity layer being grown during the epitaxial growth process resulting in a change in resistivity of that grown layer. This has led to a fear that the resulting transistor has a deteriorated characteristic. Therefore, the high resistivity semiconductor layer cannot be thinned.

The present invention contemplates providing a semiconductor memory device which is resistant to α rays by controlling the resistivities of predetermined positions of a semiconductor substrate.

Figure 2:
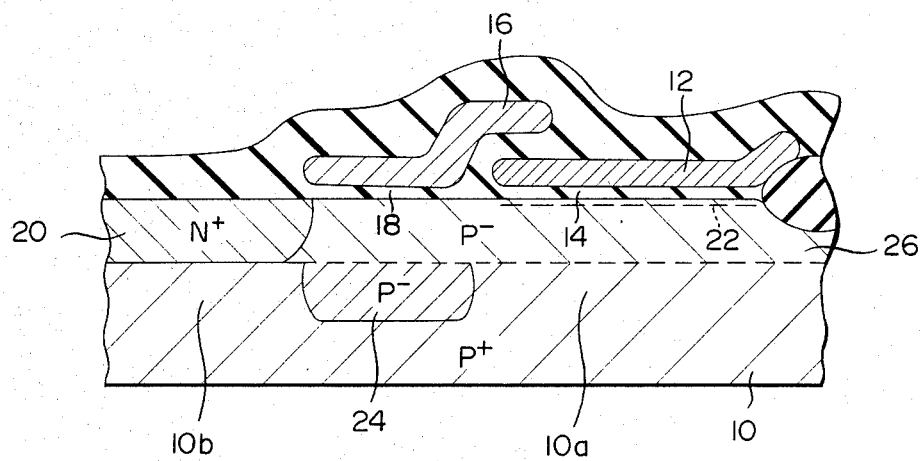
FIG. 2 is a sectional view of one embodiment according to the memory cell of the present invention including a single transistor and a single capacitor.

Referring now to FIG. 2 wherein like reference numerals designate the components identical or corresponding to those shown in FIG. 1, there is illustrated one embodiment according to the semiconductor memory cell of the present invention. The arrangement illustrated is different from that shown in FIG. 1 only in that in FIG. 2 the semiconductor substrate includes therein a first region 24 disposed below the gate electrode 16 of the transfer transistor, and a surface region 26 disposed on the surface of the substrate 10 except for that portion thereof overlaid with a high impurity concentration region 20 opposite in conductivity type to the substrate 10 and corresponding to the diffusion region 20 shown in FIG. 1 and that the two regions 24 and 26 are identical in conductivity type to and higher in resistivity than the semiconductor substrate 10.

In order to produce the arrangement shown in FIG. 2, one may first prepare a p type silicon substrate used in producing ordinary n-channel MOS devices. That is, the silicon substrate has a crystalline orientation <100>, and a low resistivity of 1 to 0.01 Ωcm. The prepared substrate is also designated by the reference numeral 10. Then, a photolithographic technique which is well known in the art is used to coat the entire surface of the silicon substrate 10 with a resist except for that portion thereof forming the region 24 at the later steps. Subsequently, by using the coated resist as a mask, ions of an n type conductivity imparting impurity are implanted into the substrate 10 according to an ion implantation technique which is also well known in the art. This results in the region 24 having an increased resistivity. The n type impurity preferably has a diffusion coefficient which is substantially equal to that of a p type impurity included in the semiconductor substrate 10. For example, when boron (B) is included in the substrate 10 as the p type impurity, phosphorus (P) is used as the n type impurity.

After the mask has been removed from the silicon substrate 10, the well-known epitaxial growth technique is used to grow a surface region 26 identical in conductivity type to the substrate 10 on the latter to a thickness of from 1 to 2 μm. The surface region 26 preferably has a resistivity on the order of 10 Ωcm and is equal to that of the ion implanted region 24. During this epitaxial growth and the succeeding heat treatments, the impurity, boron from the semiconductor substrate 10, is diffused into the surface region 26 except for the ion implanted region 24. This results in the formation of an inner region 10a. However, that portion of the surface region 26 underlaid with the ion implanted region 24 can be maintained at a high resistivity because the latter region 24 has been compensated to a p− type conductivity by having ions of the n type impurity or phosphorus (p) implanted thereinto.

Subsequently, any of the well-known processes for producing the arrangement as shown in FIG. 1 is repeated to complete the arrangement as shown in FIG. 2. This results in an n channel MOS structure with two conventional polycrystalline silicon layers 12 and 16 disposed on the substrate 10–26.

The arrangement illustrated in FIG. 2 is fully identical in operation to that shown in FIG. 1. More specifically, in order to write data into the memory capacitor shown in FIG. 2, a bit line or the N+ type high impurity concentration region 20 is supplied with a potential as determined by the data to be stored. For example, if the data to be stored has a value of binary "1", then the potential is positive. On the other hand, if the data to be stored is a binary "0", then the potential has a zero magnitude.

Following this, a voltage is applied to the transfer gate 16 through the word line (not shown) connected thereto to turn an associated transfer transistor on. This turn-on of the transistor results in the writing of the binary "1" or "0" in the memory capacitor as the case may be. Thereafter, the transistor is turned off and the arrangement shown in FIG. 2 or the memory cell is placed and maintained in its written state.

With the memory cell maintained in its written state, a semiconductor chip including the same may be irradiated with α rays from a package therefor. This irradiation with the α rays causes a multitude of electron-hole pairs within the p type semiconductor substrate 10 adjacent to the silicon surface. For example, about $10^6$ electron-hole pairs are caused in the substrate within a depth of about 25 μm from the surface thereof although the number of electron-hole pairs and the depth are dependent upon energy of α rays involved. For n-channel MOS devices, holes are normally absorbed by the p type silicon substrate 10 but electrons are diffused into the substrate to approach the memory capacitor. Under these circumstances, those electrons are collected by the memory capacitor disposed in conventional memory cells such as shown in FIG. 1. Therefore, a potential on the memory capacitor is decreased whereby the stored data is changed or erased.

However, in the arrangement shown in FIG. 2, the internal region 10a with the low resistivity is formed of that portion of the semiconductor substrate 10 disposed below the memory capacitor and electrons and holes within the internal region 10a are short in lifetime. As a result, the electrons scarcely reach the memory capacitor. In other words, the memory capacitor is scarcely affected by electrons developed within the substrate 10.

Also, the surface region 26 is disposed below the second polycrystalline silicon layer 16 or the layer forming the gate electrode of the transfer transistor and is high in resistivity. Therefore, the threshold voltage of the transfer transistor is not affected by the high concentration impurity.

From the foregoing it is seen that the present invention provides a dynamic MOS memory cell which is resistant to α rays without the characteristics of its associated transfer transistor being adversely effected.

While the present invention has been illustrated and described in conjunction with a single preferred embodiment thereof, it is to be understood that numerous changes and modifications may be resorted to without departing from the spirit and scope of the present invention. For example, a p+ type internal region 10b may be disposed below the n+ type high impurity concentration region 20 as shown in FIG. 2 to form a bit line resistant to α rays. This is because it is known that the bit line formed of the region 20 is also affected by α rays. Furthermore, while the present invention has been described in conjunction with dynamic memory cells using the n-channel MOS transistor it is equally applicable to those using the p-channel MOS transistor with the conductivity type of the components reversed from that illustrated.

What is claimed is:

1. A process of manufacturing a semiconductor memory device comprising the steps of: selectively implanting, into a main surface of a semiconductor substrate of a first type of conductivity, a second type of conductivity forming impurity so as to form impurity implanted regions of said first type of conductivity which are higher in resistivity than said semiconductor substrate; epitaxially growing surface regions on said semiconductor substrate including said impurity implanted regions, said surface regions being similar in resistivity to said impurity implanted regions; forming a bit line region of said second type conductivity in said surface regions except for a portion of said surface regions which are disposed on said impurity implanted regions, said bit line region reaching said semiconductor substrate from the surface of said surface regions; and forming a gate electrode of a transfer gate transistor above said surface regions and also above said impurity implanted regions through an electrically insulating material and forming through said electrically insulating material an electrode of a capacitor above a portion of said surface regions which are located opposite to said bit line region with respect to said portion of said surface regions disposed on said impurity implanted regions.

2. A process of manufacturing a semiconductor memory device as claimed in claim 1, wherein said semiconductor substrate is a P type silicon substrate doped with boron and said impurity implanted regions are formed by selectively implanting phosphorus as an N type impurity into said semiconductor substrate.

3. A process of manufacturing a semiconductor memory device as claimed in claim 1, wherein said semiconductor substrate is a P type silicon substrate having a resistivity of from 1 to 0.01 Ωcm.

* * * * *